United States Patent
Driscoll et al.

(10) Patent No.: US 7,170,357 B1
(45) Date of Patent: Jan. 30, 2007

(54) CRYSTAL OSCILLATOR WITH WIDE TUNING RANGE

(75) Inventors: Michael M. Driscoll, Woodstock, MD (US); Karl M. Metzger, Westminster, MD (US); Christopher R. Vale, Elkridge, MD (US); Norman G. Matthews, Pasadena, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 42 days.

(21) Appl. No.: 11/071,443

(22) Filed: Mar. 4, 2005

(51) Int. Cl.
*H03B 5/32* (2006.01)

(52) U.S. Cl. ............ 331/158; 331/116 R; 331/116 FE; 331/135; 331/162

(58) Field of Classification Search ........... 331/158, 331/116 R, 116 FE, 162, 135
See application file for complete search history.

(56) References Cited

U.S. PATENT DOCUMENTS

| 4,851,790 A | 7/1989 | Driscoll ............ 331/116 R |
| 5,250,871 A | 10/1993 | Driscoll et al. ............ 310/348 |

*Primary Examiner*—Arnold Kinkead
(74) *Attorney, Agent, or Firm*—Birch, Stewart, Kolasch & Birch, LLP

(57) ABSTRACT

A crystal oscillator having a crystal filter with multiple crystals in a ladder configuration, resonant at a desired operating frequency. An oscillatory signal loop feedback path includes a voltage controlled phase shifter operable to shift the phase of the signal in the feedback loop in response to an applied control voltage. The feedback loop also includes a loop phase shift circuit to ensure that the feedback signal is a multiple of 360°, and a band pass mode selection circuit for eliminating unwanted frequencies.

4 Claims, 3 Drawing Sheets

1

CRYSTAL OSCILLATOR WITH WIDE TUNING RANGE

BACKGROUND OF THE INVENTION

1. Field of the Invention

The invention in general relates to electronic oscillators and more particularly to a crystal oscillator utilizing a plurality of piezoelectric crystals.

2. Description of Related Art

A crystal oscillator is an electronic circuit that produces electrical oscillations at a particular designed frequency determined by the physical characteristics of one or more crystals, generally of quartz, positioned in the circuit feedback loop.

During operation of the crystal oscillator, the output frequency may drift relative to the designed frequency, necessitating a tuning operation to bring it back. For this purpose a tuning mechanism can be provided. Crystal oscillators are conventionally tuned by inserting a variable reactance circuit in series with the crystal. Electrical tuning is normally accomplished using variable capacitance (varactor) diodes to provide the variable reactance. A typical crystal oscillator utilizing varactor diodes for tuning is described in U.S. Pat. No. 4,851,790.

The tuning range of a typical crystal oscillator is however limited to a small tuning range such that it may not be possible to bring the frequency back to the desired value if the output frequency drifts too far.

Primary drift mechanisms are associated with changes in crystal environmental stress (temperature, pressure, etc) and also with long-term aging. Long-term aging is a particular problem in crystal oscillators designed to produce a low noise output signal. This is because aging is more severe in crystals necessarily operated at high drive levels in order to achieve a high signal-to-noise ratio. If the crystals age too far off frequency, the circuit may not be able to tune back to the designed frequency, due to the limited tuning range associated with such crystal oscillators.

It is therefore a primary object of the present invention to provide a crystal oscillator having a tuning range significantly greater than that of typical prior art crystal oscillators.

SUMMARY OF THE INVENTION

A crystal oscillator is provided having an oscillatory signal loop feedback path, and which includes a crystal filter incorporating a plurality of crystals such that the center of the crystal filter passband is nominally at the intended oscillator RF operating frequency. A voltage controlled phase shifter having an input, an output and a control input is used to intentionally introduce phase shift in the signal passing through it in the feedback loop in response to a voltage applied to the control input. The phase shifter RF output is fed to the input of an RF amplifier for providing requisite signal gain in the oscillator feedback loop and is used along with a power divider having first and second outputs. The first output constitutes the RF output of the crystal oscillator, and the second output is coupled to the crystal filter. A loop phase shift circuit is connected in the feedback loop for ensuring that the total feedback loop phase shift at the oscillator operating frequency is a multiple of 360°. A band pass mode selection circuit is additionally used in the feedback loop for attenuating signals occurring at unwanted crystal resonant responses, while passing the signal at the operating frequency.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1:
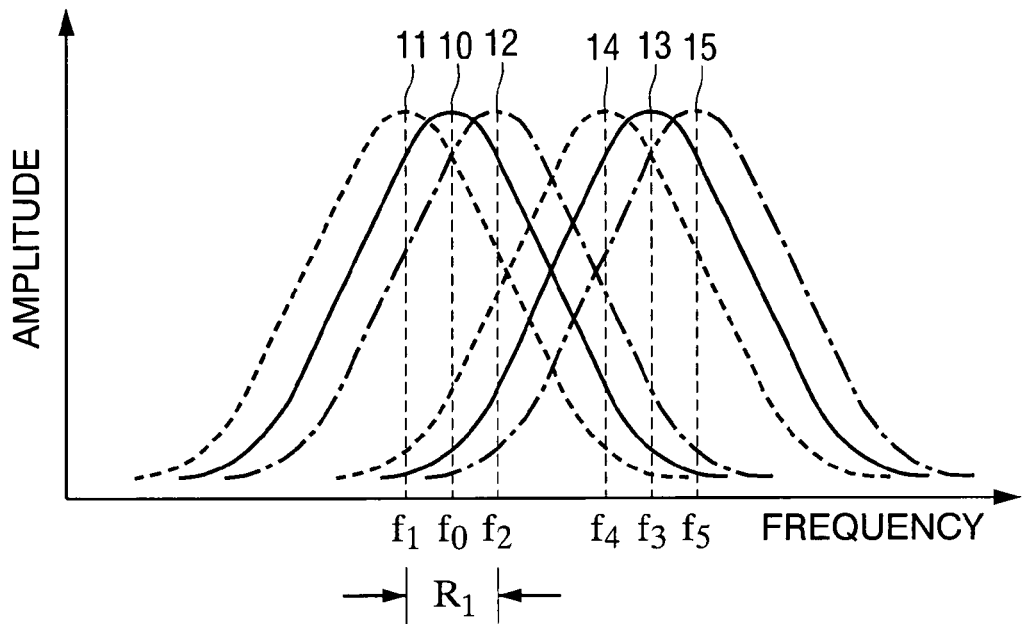
FIG. 1 illustrates the transmission response associated with a typical crystal oscillator.

FIG. 1 illustrates the amplitude vs. frequency response of the signal through the crystal arrangement of a typical crystal oscillator such as described in the aforementioned U.S. Pat. No. 4,851,790. Curve 10, shown solid, has its peak, or maximum transmission, at the nominal resonant frequency of operation $f_0$. This $f_0$ also represents the nominal oscillator operating frequency.

If a varactor diode circuit is inserted in series with the crystal(s), application of a tuning voltage to the diodes will cause the response of FIG. 1, and the resultant oscillator operating frequency to vary below and above $f_0$ to $f_1$ and $f_2$, shown by curves 11 and 12. The total oscillator tuning range is $f_2-f_1$. Due to crystal aging, or other reasons, the operating frequency may drift to a position illustrated by curve 13. At this position the peak of the curve has increased to a frequency of $f_3$ which lies outside the oscillator tuning range, shown as frequency $f_4$ and $f_5$, and curves 14 and 15. Operation or aging may also cause the response to decrease in frequency. If the extent of the drift exceeds the tuning range, the oscillator frequency can no longer be tuned back to the desired nominal operating frequency $f_0$.

By way of example, if the designed operating frequency $f_0$ is 160 MHz, $f_1$ would typically be 160 MHz–250 Hz, or 159.999750 MHz, and $f_2$ would typically be 160 MHz+300 Hz, or 160.0003 MHz. Thus the entire tuning range of such circuit would be only 550 Hz, as indicated by the range $R_1$ in the figure. Under these conditions, if the oscillator frequency drifted to a frequency below 159.99975 MHz or to a frequency above 160.0003 MHz, the oscillator could no longer be tuned to the desired, 160 MHz operating frequency. The non-symmetrical tuning range cited in this example results from the typical capacitance vs voltage characteristics of the tuning varactor diodes.

Figure 2:
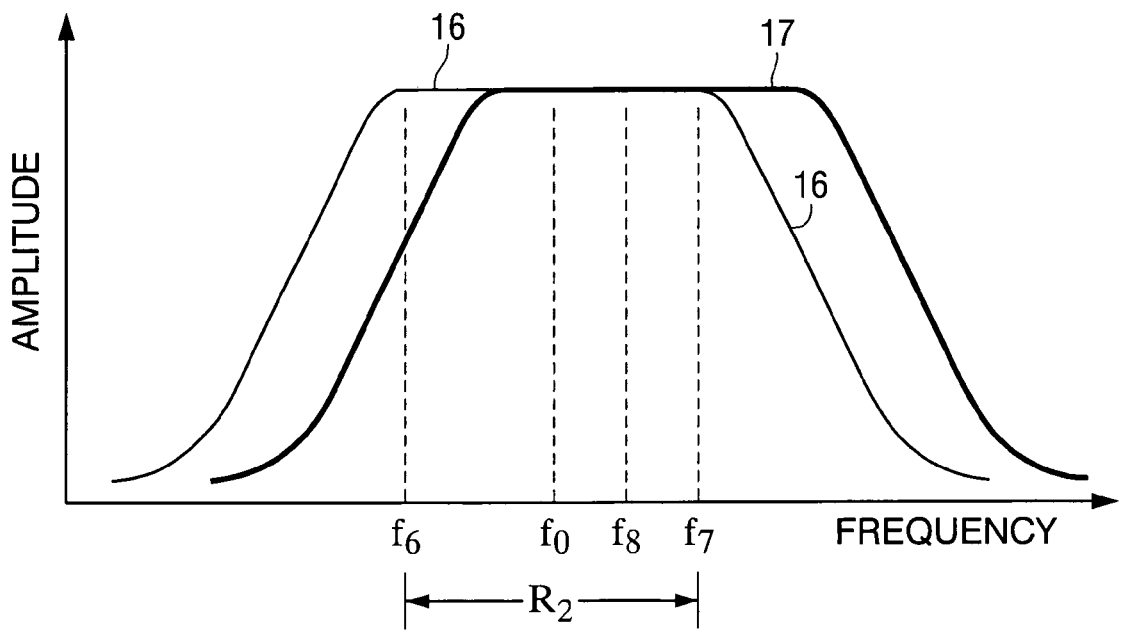
FIG. 2 illustrates the transmission response associated with the crystal oscillator of the present invention.

By way of contrast, curve 16 of FIG. 2 illustrates the transmission response for the crystal arrangement of the present invention. Curve 16 is relatively flat between frequencies $f_6$ and $f_7$ defining a tuning range of $R_2$, which is greater than the tuning range $R_1$ illustrated in FIG. 1. For the same operating frequency of $f_0$=160 MHz, $f_6$ would be 160 MHz–2 KHZ, or 159.9980 MHZ, and $f_7$ would be 160 MHz+2 KHZ, or 160.0020 MHz, defining a tuning range $R_2$ of 4 KHz, as opposed to 550 Hz for the FIG. 1 case.

It is to be noted that with the crystal arrangement utilized in the present invention, curve 16 also moves to $f_8$ as a result of drift in the crystals, shown as curve 17. However, because the tuning range in the oscillator of the present invention is the passband portion of curves 16 and 17 in FIG. 2, the oscillator can be retuned to the desired frequency even after considerable drift has occurred.

Figure 3:
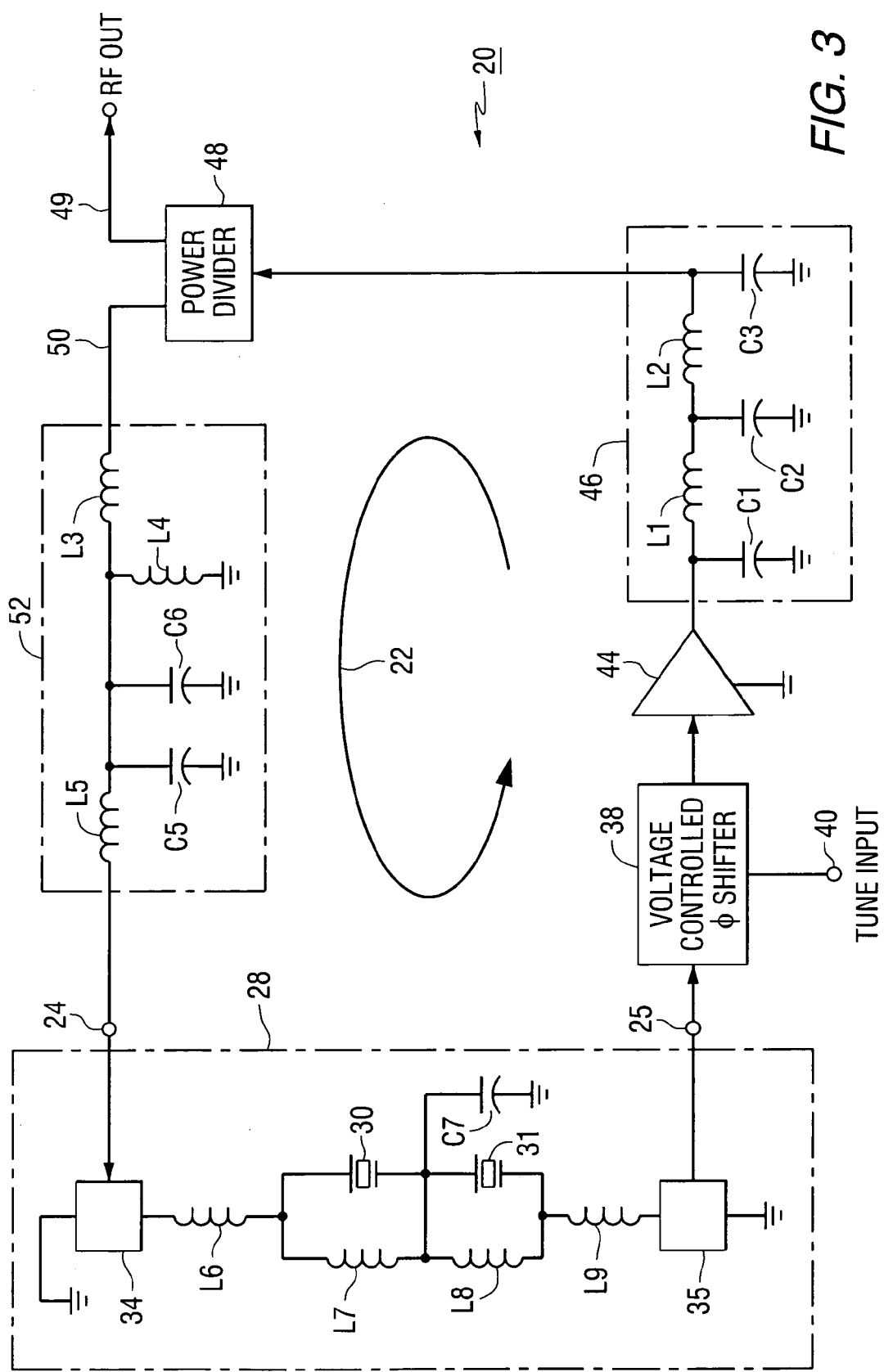
FIG. 3 is a schematic diagram of a crystal oscillator in accordance with one embodiment of the present invention.

FIG. 3 illustrates an improved crystal oscillator 20 in accordance with one embodiment of the present invention. Crystal oscillator 20 has an oscillatory signal loop feedback path, as indicated by arrow 22. The feedback path includes a two-port, that is, an input port 24 and output port 25, multi-pole crystal filter 28, having a plurality of resonant crystals, of which two, 30 and 31, are illustrated by way of example.

For comparison purposes, crystals 30 and 31 are of the same type as described in the referenced patent, that is, each crystal is an SC (stress compensated) cut crystal operating at the $5^{th}$ harmonic, or overtone. In order to compensate for any potential vibration of the apparatus which may affect the operating frequency, the crystals are preferably mounted with their crystallographic axes in an antiparallel relationship, as fully described in U.S. Pat. No. 5,250,871, which is hereby incorporated by reference.

Figure 4A:
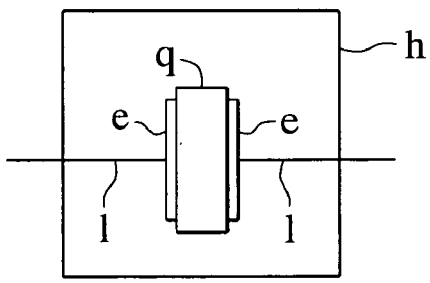
FIG. 4A is a representation of a crystal resonator.

A crystal resonator representation is illustrated in FIG. 4A. The arrangement of FIG. 4A includes a crystal q, such as quartz, having electrodes e on opposite parallel faces thereof, with the electrodes e being connected to respective leads l. The components are housed in a holder h.

Figure 4B:
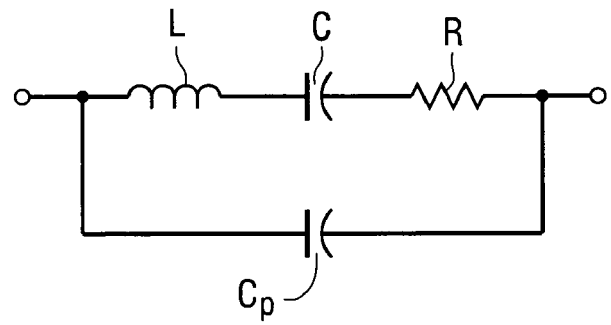
FIG. 4B is an electrical equivalent of the crystal resonator of FIG. 4A.

An electrical equivalent circuit of the crystal resonator is illustrated in FIG. 4B. The equivalent circuit includes series LCR components of particular values which provide resonance at the desired $5^{th}$ overtone. The LCR components are in parallel with capacitor $C_p$, which represents the capacitance of the crystal electrodes plus the capacitance of the leads and holder.

Referring once again to FIG. 3, crystal filter 28 includes inductors L7 and L8 in parallel with respective crystals 30 and 31. These inductors L7 and L8 are provided to cancel the effects of the capacitance $C_p$ associated with each crystal so that only a pure $5^{th}$ overtone series resonant response will be provided.

Crystal filter 28 is of the type known as a ladder filter and as such, includes capacitor C7 which is a reactive coupling element connected between adjacent crystals 30 and 31. Other types of crystal filters, such as lattice filters may also be used herein. The inclusion of C7, however, moves the filter center frequency off of the designed 160 MHz. Accordingly, inductors L6 and L9 are provided to compensate for this to set the filter center frequency to the same frequency as that of the crystal.

Circuits 34 and 35 of crystal filter 28 are provided for impedance matching the crystal filter 28 to the remainder of the crystal oscillator circuitry. It is this particular design of the crystal filter 28 that results in the relatively flat and relatively wide tuning range $R_2$ illustrated in FIG. 2.

The oscillatory signal loop feedback path of crystal oscillator 20 includes a voltage controlled phase shifter 38 which acts as the tuning device for the crystal oscillator 20. Voltage controlled phase shifter 38 has an input 40 to which is applied a voltage resulting in a phase shift of the signal in the oscillatory signal loop feedback path. The phase vs frequency response of the crystal filter 28 is illustrated in FIG. 5.

Figure 5:
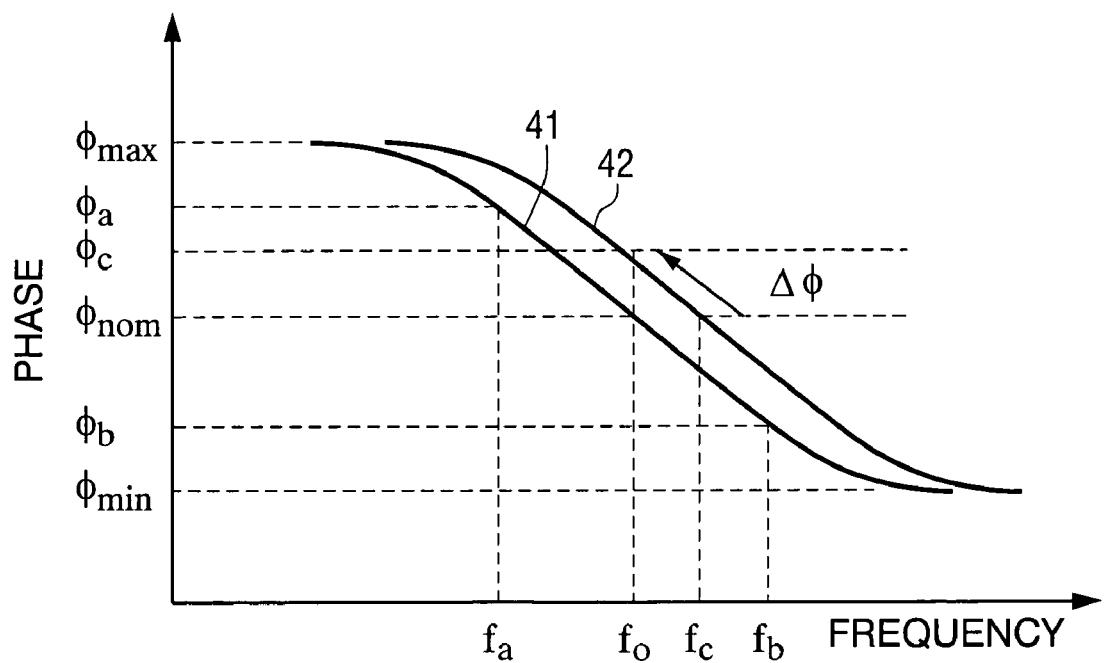
FIG. 5 illustrates curves of phase change vs frequency employed in the circuitry of FIG. 3.

In FIG. 5, curve 41 between $f_a$ and $f_b$, defines the range $R_2$, and corresponding respectively to phase $\phi_a$ and phase $\phi_b$. The phase vs frequency curve 41 is relatively linear and passes through the resonant frequency $f_0$ at $\phi=\phi_{nom}$. If, for example, an undesired frequency drift in the crystals 30 and 31 (and thus, in the crystal filter 28) occurs from $f_0$ to $f_c$ (from curve 41 to curve 42), the oscillator frequency can be retuned to the nominal operating frequency $f_0$ by applying a predetermined voltage to the input 40 of voltage controlled phase shifter 38 to cause a phase change of an amount $-\Delta\phi$. When this happens, it forces an equal and opposite phase change, $+\Delta\phi$ (as shown in FIG. 5), to occur in the crystal filter phase shift in order to maintain the total oscillator feedback loop phase shift at n360° from $\phi_{nom}$ to $\phi_c$ thus bringing operation back to the intended frequency.

The particular voltage applied to input 40 of voltage controlled phase shifter 38 may be applied via manual adjustment as a result of an analysis of the crystal oscillator output frequency. Alternatively, the crystal oscillator 20 may be locked to a stable frequency reference such as may be supplied by an atomic clock. Any deviation between the stable frequency reference and the oscillator 20 output would create an error signal, which in turn, would be applied to the voltage controlled phase shifter 38 to bring the output frequency of the oscillator back into synchronism with the reference signal. In another application, if, for some reason, operation is desired at a frequency other than $f_0$, but inside the range of $R_2$, the appropriate voltage may be applied to voltage controlled phase shifter 38 to add the proper amount of phase so as to attain the new desired frequency.

The output of the voltage controlled phase shifter 38 is connected to an amplifier 44, which, along with other components of the crystal oscillator 20 inserts some delay in the signal transmission around the oscillatory signal loop feedback path. A condition for oscillation is that the fed back signal must reinforce itself and therefore must be some multiple of 360° (n360°). Accordingly, a loop phase shift circuit 46, comprised of serial inductors L1 and L2, and parallel capacitors C1, C2 and C3, is included to add the necessary phase shift so that the total feedback loop phase shift at the desired operating frequency is a multiple of 360°.

The signal from loop phase shift circuit 46 is provided to a power divider 48 having first and second outputs 49 and 50. First output 49 constitutes the RF output of the crystal oscillator 20 while second output 50 goes to a band pass mode selection circuit 52 having series inductors L3 and L5, and parallel components including inductor L4, and capacitors C5 and C6. This latter circuit is essentially a bandpass filter which basically ensures that there is not enough loop gain to operate at any other crystal resonant frequency other than that at the selected $5^{th}$ overtone. That is, the band pass mode selection circuit 52 attenuates signals occurring at unwanted crystal response frequencies, while passing the signal at the desired frequency.

Thus with the present invention, the crystal filter 28, with multiple crystals, provides a relatively wide tuning range which, in conjunction with the voltage controlled phase shifter 38 allows tuning back to a designed frequency if there is drift in the output frequency due to aging or environmental stress in the crystals. This tuning is accomplished over a much wider tuning range than conventional crystal oscillators allow.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A crystal oscillator having an oscillatory signal loop feedback path, comprising:
   a crystal filter having a plurality of crystals resonant at a nominal RF operating frequency, wherein each said crystal of said plurality of crystals is joined with an adjacent crystal of said plurality of crystals; and which includes
   a plurality of inductors, each in parallel with a respective one of said crystals to neutralize the effects of static capacitance associated with each said crystal; and
   a reactive coupling element coupled between each pair of adjacent crystals of said plurality of crystals;
   a voltage controlled phase shifter having an input, an output and a control input and operable to phase shift the signal in said feedback loop in response to a voltage applied to said control input;
   an amplifier for amplifying the output of said voltage controlled phase shifter;
   a power divider having first and second outputs, said first output constituting the RF output of said crystal oscillator, said second output being coupled to said crystal filter;
   a loop phase shift circuit connected in said feedback loop for ensuring that the total feedback loop phase shift at the operating frequency of said oscillator is a multiple of 360°; and
   a band pass mode selection circuit in said feedback loop for attenuating signals occurring at unwanted crystal resonant responses, while passing the signal at said operating frequency.

2. An oscillator according to claim 1 wherein:
   said plurality of crystals is comprised of two crystals.

3. An oscillator according to claim 1 wherein:
   said amplifier has an input and an output, with said input being connected to said output of said voltage controlled phase shifter;
   said loop phase shift circuit being connected to said output of said amplifier;
   said power divider being connected to said loop phase shift circuit; and
   said band pass mode selection circuit being connected between said second output of said power divider and said crystal filter.

4. An oscillator according to claim 1 wherein:
   said crystal filter includes impedance matching circuits for matching the impedance of said crystal filter to the circuitry to which it is connected.

* * * * *